United States Patent [19]

Rodin et al.

[11] Patent Number: 4,727,645

[45] Date of Patent: Mar. 1, 1988

[54] DEVICE FOR SURFACE MOUNTING OF COMPONENTS

[75] Inventors: Gunnar Rodin, Bromma; Lennart Stridsberg, Enskede, both of Sweden

[73] Assignee: Mydata Automation AB, Stockholm, Sweden

[21] Appl. No.: 890,849

[22] PCT Filed: Nov. 18, 1985

[86] PCT No.: PCT/SE85/00468

§ 371 Date: Sep. 17, 1986

§ 102(e) Date: Sep. 17, 1986

[87] PCT Pub. No.: WO86/03367

PCT Pub. Date: Jun. 5, 1986

[30] Foreign Application Priority Data

Nov. 19, 1984 [SE] Sweden ............................ 8405803

[51] Int. Cl.$^4$ ............................................ B23P 19/04
[52] U.S. Cl. ........................................ 29/740; 29/593; 29/712; 29/759
[58] Field of Search ................ 29/740, 739, 741, 743, 29/759, 712, 593

[56] References Cited

U.S. PATENT DOCUMENTS

| | | | |
|---|---|---|---|
| 4,151,945 | 5/1979 | Ragard et al. | 29/740 |
| 4,286,380 | 9/1981 | Blount | 29/593 |
| 4,417,683 | 11/1983 | Lewis et al. | 29/741 |
| 4,557,043 | 12/1985 | Starski | 29/741 |
| 4,610,473 | 9/1986 | Hawkswell | 29/743 |

OTHER PUBLICATIONS

"Komponentmontering"—*Modern Elektronik*, 11/9/84.
"Ytmonterar i automat"—*Elektronik Medaktrell Elektronik*, 9/84.
"Mottagningskontroll Och Fortenning"—*Medern Elektronik*, 11/9/84.
"Surface Mounting Alters PC-Board Scene"—*Electronic*, 2/9/84.

Primary Examiner—P. W. Echols
Attorney, Agent, or Firm—Burns, Doane, Swecker & Mathis

[57] ABSTRACT

The invention relates to an apparatus for surface mounting of components (201) on a support (106). The arrangement comprises a positioning device )102, 103, 104) for holding and moving the components to a mounting position relative to the support. A centering arrangement of two components (203, 204) movable towards and from each other and disposed to center the component from opposite sides concurrently with its movement to the mounting position is provided. The centering arrangement (203, 204) comprises two centering electrodes (300, 310) which are designed with recesses (301, 302, 305, 306) which are adapted to the form and the size of the different component types to be mounted. The centering electrodes moreover comprise electric contact members (307, 308, 706) which are intended to connect the component to an equipment for measuring its electrical properties.

5 Claims, 10 Drawing Figures

DEVICE FOR SURFACE MOUNTING OF COMPONENTS

THE OBJECTS OF THE INVENTION AND ITS MOST SIGNIFICANT CHARACTERISTICS

Pick and place machines for surface mounting of electronic components fetch the components from a magazine and place them on a substrate, e.g. in the form of a printed circuit board. The present invention relates to an apparatus which at low price provides a number of advantageous properties in a pick and place machine, viz.:

mounting of component with extremely varying size, e.g. from 2×1.2 mm to 34×34 mm without change of centering tool centering of the component relative to the housing centering of the component relative to the connecting leads mechanical measurement of the component housing mechanical measurement of the distances between the external connecting leads of the component connection of the leads to a test equipment to measure its electrical properties, and centering and measurement of mechanical and electrical properties concurrently with the movement of the component which means without time loss under normal conditions.

THE BACKGROUND OF THE INVENTION AND PRESENT PROBLEMS

Mounting of surface mounted components involves a number of problems compared to the old technique of mounting components, the leads of which are mounted in holes. These problems are as follows:

(1) The components are placed on a surface. The mounting error will therefore be continuously variable which leads to boundary problems between acceptable and unacceptable mounting. The old art components have a binary mounting error which means that either all leads are in their holes or they are not.

(2) There are different reasons for an increased interest to glue the components before soldering. This puts increased demands on the mounting position. Up till now the components have mostly been mounted on soldering paste. During the soldering operation surface tension phenomena will cause an automatic centering of the component. However, if the component is glued this centering effect will be eliminated.

(3) The components are small. The distance between the leads on a component old in the art is almost always 2.54 mm or more. For surface mounted components it is 1.27 or 0.80 mm and will decrease in the future.

(4) Machines for mounting of components old in the art utilize guiding holes which are drilled in the same operation as those in which the components should be mounted. The errors between the guide holes and the component holes will therefore be relatively insignificant.

(5) The components are so small that they mostly cannot be provided with identifying text. This increases the demand to measure the component electrically before mounting to ensure that the correct component will be mounted.

Items 1-4 above will together present great difficulties when mounting components with a lead distance of 1.27 mm and less by gluing. The enterprise Elektronikcentralen i Denmark which is well known in the Nordic countries has issued a study No. ECR-143 with the title "Leadless components" and in the fifth chapter, page 15, they have reached the conclusion that "from the present prerequisites the only solution now is to utilize manual mounting only and thereby introduce an optical correction of certain tolerances".

The actual Swedish production of surface mounted components with the lead distances 1.27 and 0,80 mm is often handmade even in the simpler case when the components are not glued.

Existing machines for surface mounting reflect the statements made above. These machines can be divided into different types, namely:

specialized machines which can only mount components having a size within very narrow limits, e.g. from 2×0.8 mm up til 3.2×2.0 mm. These machines often have high capacity and a high price.

Module machines are built up by a number of mounting stations each of which is specialized for a certain group of components of the same of almost the same size and design. Thus, a customer who uses many different component types must have a number of modules and will therefore have to pay a high price.

Machines without a centering operation fetch the components and move them. Thus, all errors in the fetch point component position will remain after the mounting operation.

The apparatus according to the invention makes it possible to arrange both effective centering and possibilities for connecting the component to an electronic measuring equipment with a minimum of mechanical components.

DESCRIPTION OF THE DRAWINGS

The invention will now be described with reference to the enclosed drawing Figures. Moreover, the application of the invention will be shown on a machine which operates with a fixed magazine, a circuit board or substrate which is movable in the Y-axis direction and a carriage which is movable in the X-axis direction and on which the apparatus according to the invention is mounted.

Figure 1:
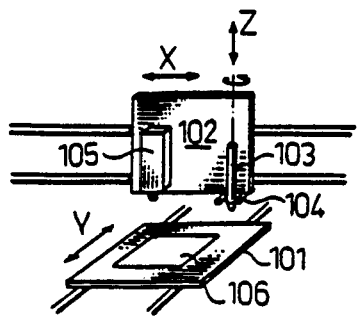
FIG. 1 shows the main parts of the machine.

The design of the machine appears on FIG. 1. It comprises a first carriage 101 which is movable in the Y-axis direction and on which the circuit board 106 is mounted. Above this first carriage there is a second carriage 102 which is movable in the X-axis direction. This second carriage supports a lifting device 103 which is movable in the Z-axis direction and which is pivotable in the ∅-direction. The second carriage also supports a centering device 104 and a TV-camera 105.

DESCRIPTION OF THE FUNCTION

Figure 2:
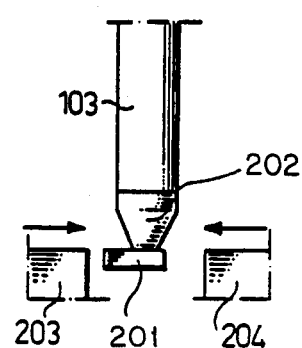
FIG. 2 shows the basic operating function of the centering device.

The elementary function of the centering device 104 appears from FIG. 2. The component 201 is lifted by the lifting device 103 by means of an underpressure and can therefore be laterally displaced relative to the nozzle 202 without falling down. The centering operation is effected by means of shoulders 203 and 204 which can be laterally moved. They are mainly moved in synchronism which means, that if the shoulder 203 is moved 1 mm to the right the shoulder 204 is simultaneously moved 1 mm to the left. When the shoulders 203 and 204 are pressed together with the component 201 between them the midpoint of the component 201 will be located in the point where the shoulders 203 and 204 should have met if there had been nothing in between them.

By carrying out the centering operation once and then turning the component 90° and performing the operation once again the component can be centered both in the X-axis and the Y-axis. By establishing a movement of the shoulders which is sufficiently wide the centering operation of components with extremely varying size will be accomplished without need for changing the centering tool. Under the assumption that the distance between the shoulders is measured with a suitable transmitter it is possible to mechanically measure the external measures of the component. By designing the shoulders as test electrodes the electric properties of two pole components can also be measured during the centering operation. By designing the shoulders 203 and 204 in a more sophisticated way and by arranging a cooperation between the movement in the Z-axis and the ∅-axis of the lifting device further optional properties can be achieved.

Figure 3:
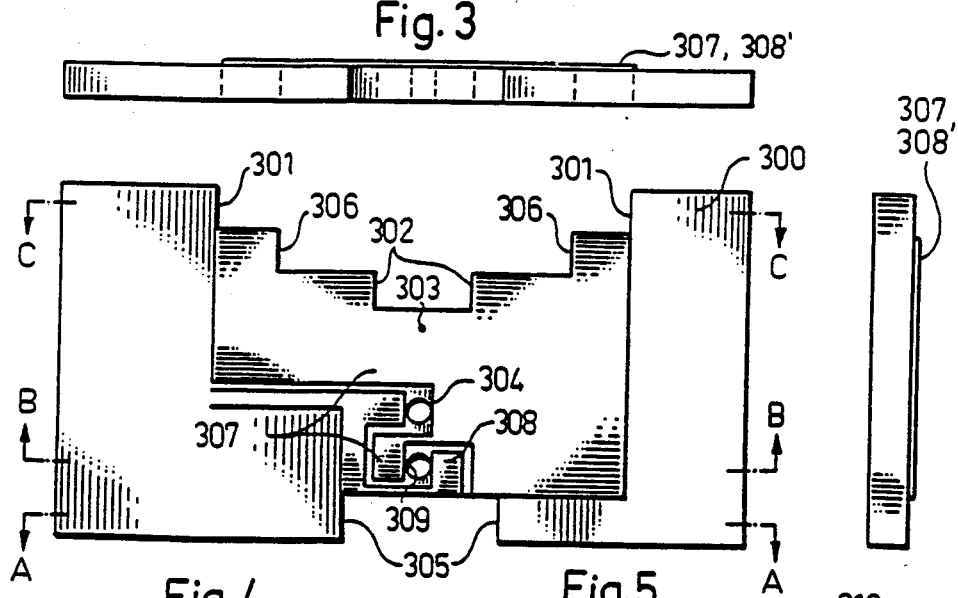
FIG. 3 shows a centering electrode for centering against the connecting leads and for connecting a three pole component to a measuring device.

FIG. 3 shows one shoulder 300 of a pair of shoulders where three such properties have been realized. The two shoulders 300 and 310 are essentially symmetrical and are hereinafter called centering electrodes. The different parts of the shoulder 300 are described in connection with the following Figures. The different sections (A-A, B-B and C-C) show which part of the centering electrode 300 the Figures refer to. The centering electrode 300 can in principle be made as a pattern board.

Thus, since the component has to be raised and lowered the centering electrode 300 can be given different functions at different levels. At the top of FIG. 3 two recesses 301 are shown which are used for centering against the housing leads as described more in detail with reference to FIG. 6. The recess 306 has a similar function for housings with other dimensions. The recesses 302 and 305 are used for a centering operation which is described more in detail with reference to FIG. 5.

On the level 303 two pole components to be used as resistances and capacitors are centered and connected for electric tests. Thereby the gold plated surface 307 can be used as the first connecting electrode whereas the other electrode is located on the opposed centering electrode 310. The level can also be used for centering bigger components before test connection.

Figure 7:
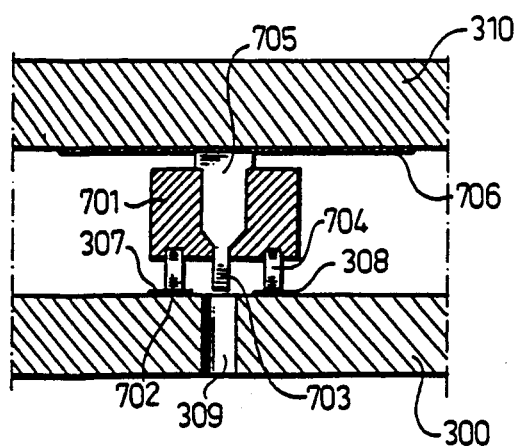
FIG. 7 shows a centering operation and connection to a test equipment of a three pole component.

In the lower level with the holes 304 three-pole components with three and four leads as shown on FIG. 7 are centered and test connected.

The centering electrodes according to FIG. 3 provide a number of new possibilities, viz.:

they accomplish centering of the component relative to the most critical dimension of the connecting leads they accomplish control measurement of the distance between the external connecting leads of the component they accomplish connection of the three pole component leads to a test equipment for measuring its electric properties.

Figure 4:
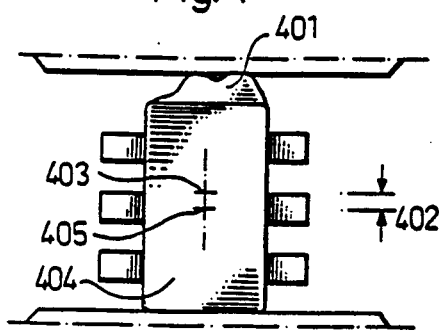
FIG. 4 shows a centering operation for the external measures of a component with two rows of connecting leads.

FIG. 4 shows how a component 404 (of the type SO-6), is centered at a conventional centering operation. The Figure shows a component with a considerable centering error between the plastic housing and the leads. Such error can arise if the plastic casting tool is erroneously centered relative to the group of leads or if so-called cast flash 401 has poured out between the two halves of the cast tool. This last mentioned type of error is common and creates problems in mounting machines. Even a perfect centering operation relative to the external measurement of the component will in such cases give substantial error 402 between the center 403 of the mounting head and the center 405 of the component leads. Mounting machines strive to place the mounting head straight over the expected position of the component on the circuit board. A deviatin between the center 403 of the mounting head and the center 405 of the component leads will therefore in average give rise to an equal deviation in the position of the component.

Figure 5:
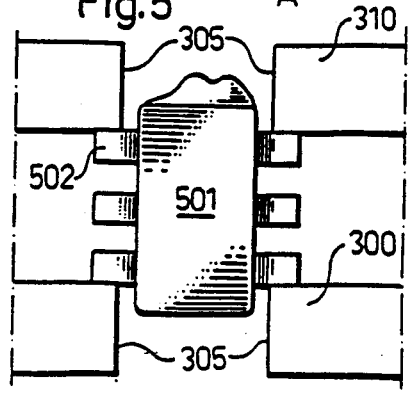
FIG. 5 shows a centering operation against the connecting leads for a component with two rows of leads.

FIG. 5 shows how the recess 305 in the centering electrode 300 could be used to center a component 501 of the type SO-6 directly against the connecting leads 502. The Figure is taken in the plane which in FIG. 3 has been marked with Section A-A. The component has already been centered in one direction against the plane surface 303 in the way described with reference to FIG. 2, and in the position shown in the Figure it is to be centered in the remaining direction. The Figure shows the centering operation from below. Therefore, both of the centering electrodes 300 and 310 can be seen. The recess 305 in the centering electrode 300 will cause the electrode to hit the connecting leads 502 during the centering operation.

Figure 6:
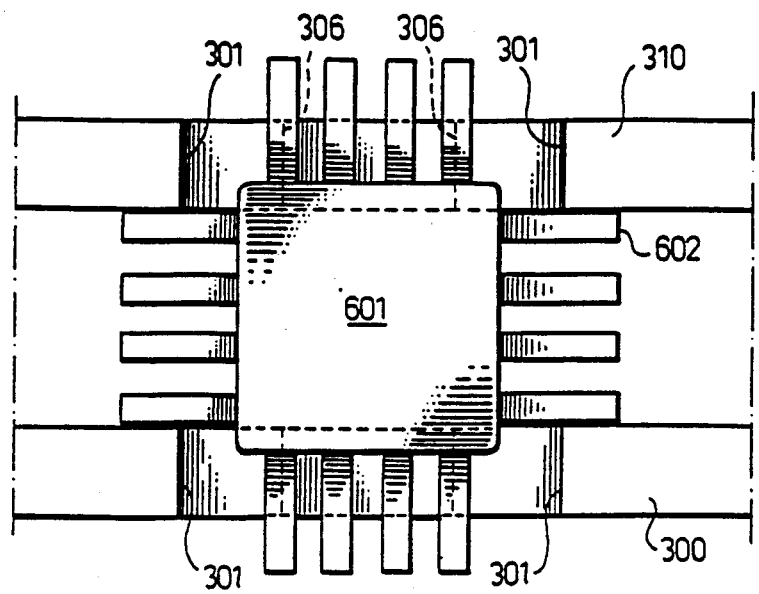
FIG. 6 shows a centering operation against the connecting leads for a component with four rows of leads.

FIG. 6 shows how the recess 301 in the centering electrode 300 can be used to center a component 601 against the connecting lead 602 in case the component has connecting leads which project from all four sides. Depending on the size of the center deviations which are obtained when the component is fetched from the magazine the component will in such cases probably have to be centered against its external measures of the surface 303 before it is centered against the connecting leads by means of the recess 301. The Figure shows the centering operation from above. Due to the recess 301 in the electrode 300 it will only make contact with the connecting leads 602. The recess 306 in the centering electrodes 300 and 310 is not shown in the Figure since it is hidden behind the component body 601.

FIG. 7 shows centering and test connection of a three pole component by means of the hole 304 on the centering electrode 300. The Figure shows a sectional view through the component and the position 304 on the centering electrode.

The component 701 has four leads but only three poles since the leads 703 and 705 are galvanically interconnected. The hole 309 in the centering electrode 300 serves to ensure a safe contact against the leads 702 and 704 since the lead 703 cannot withstand any forces. On the surfaces where the centering electrodes make contact against the component leads 702, 704 and 705 there are provided test connections 307, 308 and 706.

Figure 8:
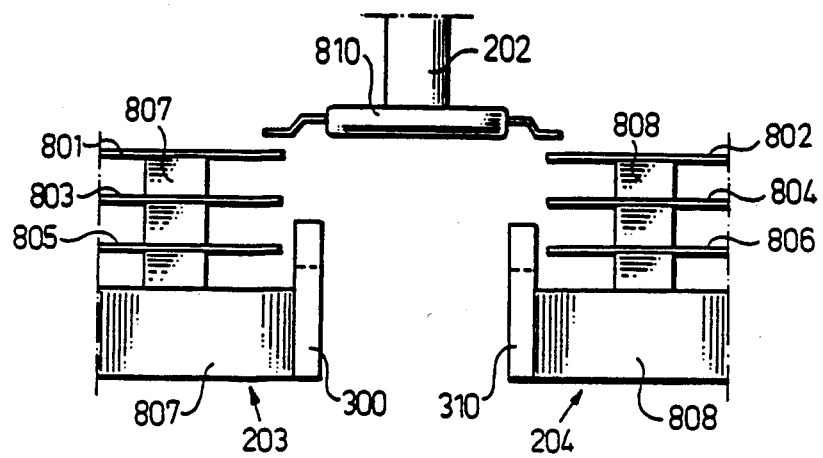
FIG. 8 shows test connection for different kinds of multipole components.

FIG. 8 shows a more complicated arrangement of connecting electrodes to measure components with more than three connections arranged in two rows so-called dual in line. As an alternative the parts 801-806 can be located in the same plane as the centering electrodes 300 and 310 and could also be made of the same board material. FIG. 8 is seen from the same view as FIG. 2. The parts 801, 803, 805 and 300 are built together mechanically with mechanical parts 807 and they are moved in the same way as the centering shoulder 203 shown in FIG. 2. The parts 802, 804, 806 and 310 are moved in the same way as the centering shoulder 204. The connecting electrodes are built up in pairs 801-802, 803-804 and 805-806.

Figure 9:
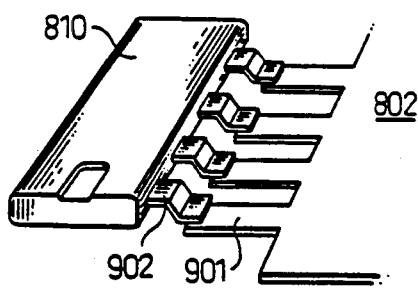
FIG. 9 shows the connecting electrode for the test of multipole components.

FIG. 9 shows a test connection with one electrode in such a pair of electrodes which fits against a component 810. The other electrode in this pair fits against the other side of the component but this is not shown on the Figure. The electrode has a number of resilient contact tongues 901 which make contact against the leads 902 of the component 810. Since different component housings have different internal distances between adjacent leads one furhter pair of electrodes is required for each lead distance. The same pair of electrodes can, however, be connected against components with different number of leads provided they have the same center distance between the leads.

When a device according to FIG. 5 is used one pair of leads will be located just between the centering electrodes if the component has an odd number of connecting leads along each side. On the other hand an interspace between the leads will be positioned between the centering electrodes if the component has an even number of connecting leads along each side. This involves a problem if a component thus centered should make contact against a pair of electrodes 801-802. One solution could be to have different pairs of electrodes for components with an odd and an even number of leads, respectively, along each side. A further possibility would be to move the electrode pairs laterally.

Figure 10:
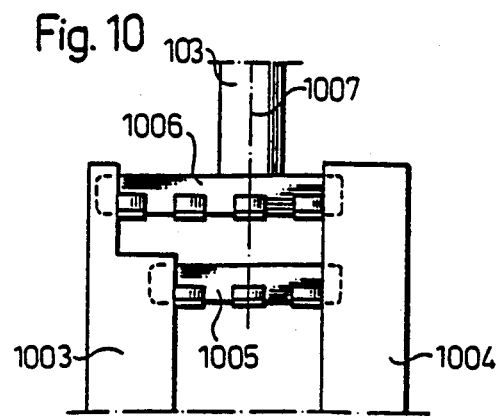
FIG. 10 shows a centering device which is adapted to the demands defined by the connecting electrodes for the test of multipole components.

FIG. 10 shows a much simpler solution with a pair of centering electrodes with two contact surfaces for the component leads. By means of these surfaces the components can be centered so that the connecting leads in both cases can be placed in the same position relative to the center line of the lifting device. FIG. 10 shows a centering operation taken from the same view as in FIG. 2. To illustrate the function the Figure shows a component with two by three leads 1005 in the lowest position concurrently with another component with two by four leads 1006 in the upper position. Practically only one component at the time can be centered. As appears from the Figure in both cases one pair of leads will be positioned in line with the center line 1007 of the lifting device 103.

The operating sequence of the machine when it fetches, centers, control measures and mounts a housing 810 of the type SO-8 will be described below with reference to the drawing.

a component 810 (201) is in some way fetched and positioned under the nozzle 202, if necessary, the component 810 (201) will be turned 90° so that it will be positioned as shown in FIG. 8, the component will be lifted to the level 303 at the centering electrode 300, the component will be centered in one direction by putting the shoulders 203 and 204 together on which the centering electrodes 300 are mounted, the size of the component will be measured in the actual direction in order to reject mechanically defective components, the shoulders 203 and 204 are moved apart and the lifting device 103 is turned 90° whereafter the lifting device 103 is raised so that the component 810 will be on the same level as a corresponding recess, e.g. 302, in the centering electrodes 300, the shoulders 203 and 204 are again put together so that the component 810 will be centered relative to the component legs in the remaining direction, measuring the component in the actual direction (to sort away any mechanically defective components), moving the shoulders 203, 204 apart and turning the lifting device 103 90°, lifting the lifting device 103 so that the component 810 is placed just above the pair of electrodes fitting against the component, e g 801-802, again bringing the shoulders 203 and 204 together so that the resilient contact tongues 901 will be positioned below the connncting legs of the component 810, lowering the lifting device 103 so that the component 810 is pressed down against the resilient tongues 901, performing the measurement of the electrical properties of the component, raising the lifting device 103 so that the component 810 is released from the contact tongues 901 and moving the shoulders 203 and 204 apart, turning the lifting device 103 so that the component 201 will obtain correct orientation, waiting until the carriage 101 has reached the right place for mounting of the component 201, waiting until the carriage 102 has reached the right place for mounting of the component 201, lowering the lifting device 103 so that the component 201 is mounted on the board or substrate 106.

A TV-camera 105 is used to determine the position of the board relative to the coordinate system of the machine by moving the carriages 101 and 102 until the TV-picture shows that the camera is positioned straight above a reference point on the board. When the position for two such reference points is determined a computer which controls the machine can easily transfer the coordinates for the board or substrate to those for the machine.

We claim:

1. An apparatus for surface mounting of components on a support, comprising a positioning device for holding and moving the components to a mounting position in relation to the support, whereby centering means are movable towards and away from each other and are arranged to center the component from opposite sides concurrently with its movement to the mounting position, characterized in that the centering means comprises two centering electrodes which are provided with recesses, the recesses having dimensions corresponding to dimensions of the components to be mounted, and that the centering electrodes comprise electrical contact members to connect the components to an equipment for measurement of its electrical properties.

2. An apparatus according to claim 1, characterized in that the dimensions of the recesses of the centering electrodes correspond to dimensions of a component body, said body being introduced into the recess at the centering operation, and lateral surfaces of the electrodes facing each other being brought into contact with external connecting leads of the component.

3. An apparatus according to claim 1, characterized in that the component has a plurality of poles, and the centering electrodes are provided with contact surfaces for making contact with the poles of the component and with holes for those poles which are not connected to the contact members.

4. An apparatus according to claim 1, characterized in that the centering means comprises connecting electrodes having a form of resilient contact elements against which connecting leads of the component are brought into contact for measuring the electrical properties of the component.

5. An apparatus according to claim 4, characterized in that the connecting electrodes are disposed in opposed pairs with different numbers of contact tongues and/or different mutual distances between the contact tongues for each pair of electrodes, whereby the electrode pairs are arranged on different levels above each other.

* * * * *